(12) United States Patent
Oh et al.

(10) Patent No.: US 7,858,986 B2
(45) Date of Patent: Dec. 28, 2010

(54) THIN FILM TRANSISTOR ARRAY PANEL AND METHOD FOR MANUFACTURING THE SAME

(75) Inventors: Min-Seok Oh, Yongin-si (KR); Seung-Ha Choi, Siheung-si (KR); Yoon-Ho Kang, Yongin-si (KR); Hong-Kee Chin, Suwon-si (KR); Yu-Gwang Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 12/243,929

(22) Filed: Oct. 1, 2008

(65) Prior Publication Data

US 2009/0184324 A1    Jul. 23, 2009

(30) Foreign Application Priority Data

Jan. 22, 2008    (KR)    ............. 10-2008-0006754

(51) Int. Cl.
*H01L 33/00*    (2010.01)
(52) U.S. Cl. ............... 257/72; 257/59; 257/E33.053; 349/106
(58) Field of Classification Search .......... 257/59, 257/72, E33.053; 349/42, 44, 48, 106
See application file for complete search history.

(56) References Cited

U.S. PATENT DOCUMENTS

| | | | |
|---|---|---|---|
| 5,177,577 A * | 1/1993 | Taniguchi et al. | ............. 257/59 |
| 7,070,890 B2 | 7/2006 | Kiguchi et al. | |
| 7,255,980 B2 | 8/2007 | Hwang et al. | |
| 2004/0109110 A1 * | 6/2004 | Kim et al. | .................... 349/106 |
| 2005/0185109 A1 * | 8/2005 | Rho et al. | ...................... 349/44 |
| 2006/0209223 A1 * | 9/2006 | Choi et al. | ..................... 349/43 |

FOREIGN PATENT DOCUMENTS

| | | |
|---|---|---|
| JP | 9-318935 | 12/1997 |
| JP | 10-307204 | 11/1998 |
| JP | 11-52126 | 2/1999 |
| JP | 11-95008 | 4/1999 |
| JP | 11-194211 | 7/1999 |
| JP | 11-209884 | 8/1999 |
| JP | 2002-341380 | 11/2002 |
| JP | 2003-21829 | 1/2003 |
| KR | 1997-0002977 | 12/1988 |
| KR | 1999-024917 | 4/1999 |
| KR | 10-0459393 | 5/2003 |
| KR | 2004-0050311 | 6/2004 |
| KR | 2004-0057688 | 7/2004 |
| KR | 2004-0057713 | 7/2004 |

* cited by examiner

*Primary Examiner*—Sue Purvis
*Assistant Examiner*—Selim Ahmed
(74) *Attorney, Agent, or Firm*—Innovation Counsel LLP (57) ABSTRACT

The present invention relates to a thin film transistor array panel and a manufacturing method thereof. The thin film transistor array panel according to the present invention includes a substrate, a light blocking member formed on the substrate, a gate line disposed on the light blocking member. The gate line and the light blocking member define a closed region A color filter is formed in the closed region and contacts the side surface of the gate line. A gate insulating layer is formed on the gate line and the color filter, a data line and a drain electrode are formed on the gate insulating layer, and a pixel electrode is connected to the drain electrode.

14 Claims, 8 Drawing Sheets

THIN FILM TRANSISTOR ARRAY PANEL AND METHOD FOR MANUFACTURING THE SAME

CROSS-REFERENCE TO RELATED APPLICATION

This application claims the benefit of priority of Korean Patent Application No. 10-2008-0006754 filed in the Korean Intellectual Property Office on Jan. 22, 2008, the entire contents of which are incorporated herein by reference.

BACKGROUND OF THE INVENTION (a) Field of the Invention

The present invention relates to a thin film transistor array panel and a method for manufacturing the same.

(b) Description of the Related Art

A liquid crystal display (LCD), a plasma display panel (PDP), a flat emission display (FED), a vacuum fluorescent display (VFD), and an organic light emitting device (OLED) are among widely used flat panel displays.

These display devices include switching elements connected to field generating electrodes, and a plurality of signal lines such as gate lines and data lines for applying voltages to the field generating electrodes by controlling the switching elements. To reduce an afterimage of the display device and to improve the resolution, it is preferable that the signal lines are thin and have low resistance.

In particular, as the size of the display devices increases, an improved response speed is required to obtain high quality images. Research aimed at improving the response speed by reducing the resistance of the signal lines has been actively pursued.

To reduce the resistance of the signal line, a display device in which the width of the signal line is increased has been proposed. However, if the width of the signal line is increased, the area occupied by the signal line is increased such that the aperture ratio is decreased.

SUMMARY OF THE INVENTION

A thin film transistor array panel according to an exemplary embodiment of the present invention includes a substrate, a light blocking member formed on the substrate, a gate line disposed on the light blocking member, the gate line together with the light blocking layer being a barrier that encloses a closed region, a color filter formed in the closed region and contacting the side surface of the gate line, a gate insulating layer formed on the gate line and on the color filter, a data line and a drain electrode formed on the gate insulating layer, and a pixel electrode connected to the drain electrode.

The planar shape of the gate line may be substantially the same as the planar shape as the light blocking member.

The planar shape of the light blocking member may be a ladder shape.

The gate line may include copper.

The gate line may include an upper layer and a lower layer, and the upper layer may include copper.

The thin film transistor array panel wherein the gate line may further include a coating formed on the surface of the upper layer.

The coating may include $CuF_2$ or $CuF_xO_y$.

The lower layer may include molybdenum or a molybdenum alloy.

The sum of the thickness of the light blocking member and the thickness of the gate line may be in a range of about 1 μm to about 4 μm.

The thickness of the upper layer may be in a range of about 0.3 μm to about 2 μm.

The thickness of the color filter may be equal to or less than the sum of the thickness of the light blocking member and the thickness of the gate line.

The light blocking member may include a metal or an organic material.

A method of manufacturing a thin film transistor array panel according to an exemplary embodiment of the present invention includes forming a light blocking member on a substrate, depositing a metal layer on the substrate and on the light blocking member, forming on the metal layer a photoexposed member and an opening adjacent to the photosensitive member, the opening exposing a portion of the metal layer, forming an upper layer of a gate line on the exposed portion of the metal layer, removing the photoexposed member, removing a portion of the metal layer that is not covered by the upper layer of the gate line to leave a lower layer of the gate line under the upper layer, forming a color filter contacting the side surface of the gate line in a region enclosed by the light blocking member and the gate line, forming a gate insulating layer on the gate line and on the color filter, forming a data line and a drain electrode on the gate insulating layer, the data line including a source electrode, and forming a pixel electrode connected to the drain electrode.

An electroless plating method may be used to form the upper layer of the gate line.

The photoexposed member may include a negative photosensitive material.

The formation of the photoexposed member may include coating the metal layer with a film of the negative photosensitive material, rear-exposing the photosensitive film, and developing the photosensitive film.

The thickness of the metal layer may be in a range of about 100 Å to about 300 Å.

The light used for the rear-exposing of the photosensitive film may be ultraviolet rays.

The color filter may be formed by an inkjet method.

The sum of the thickness of the light blocking member and the thickness of the gate line may be greater than or equal to the thickness of the color filter.

According to an exemplary embodiment of the present invention, the gate line is formed with a self-aligning method using the light blocking member as a mask such that misalignment may be prevented. Also, the alignment margin of the light blocking member is small such that the aperture ratio and the light transmittance may be improved.

Further, according to an exemplary embodiment of the present invention, when forming the color filter by using the inkjet method, the two layers of the light blocking member and the gate line are used as a bank such that an additional process to form the bank is not necessary. Accordingly, the manufacturing process of the thin film transistor array panel may be simplified, the manufacturing cost may be reduced, and productivity may be improved.

Also, according to an exemplary embodiment of the present invention, the thickness of the upper layer of the data line made of copper is selected by controlling the thickness of the photosensitive film such that the thickness of the copper upper layer of the data line may be desirably increased and thus the resistance of the gate wiring may be reduced without widening the data line and without a reduction of the aperture ratio.

BRIEF DESCRIPTION OF THE DRAWINGS

To provide a clear understanding of the advantages of the present invention an exemplary embodiment of the present invention will be described in detail with reference to the accompanying drawings, wherein.

DETAILED DESCRIPTION OF THE EMBODIMENTS

The present disclosure of invention will be provided more fully hereinafter with reference to the accompanying drawings, in which exemplary embodiments are shown. As those skilled in the art would realize in light of the present disclosure, the described embodiments may be modified in various different ways, all without departing from the spirit or scope of the present teachings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a display panel according to an exemplary embodiment of the present invention will be described in detail with reference to FIG. 1 to FIG. 3.

Figure 1:
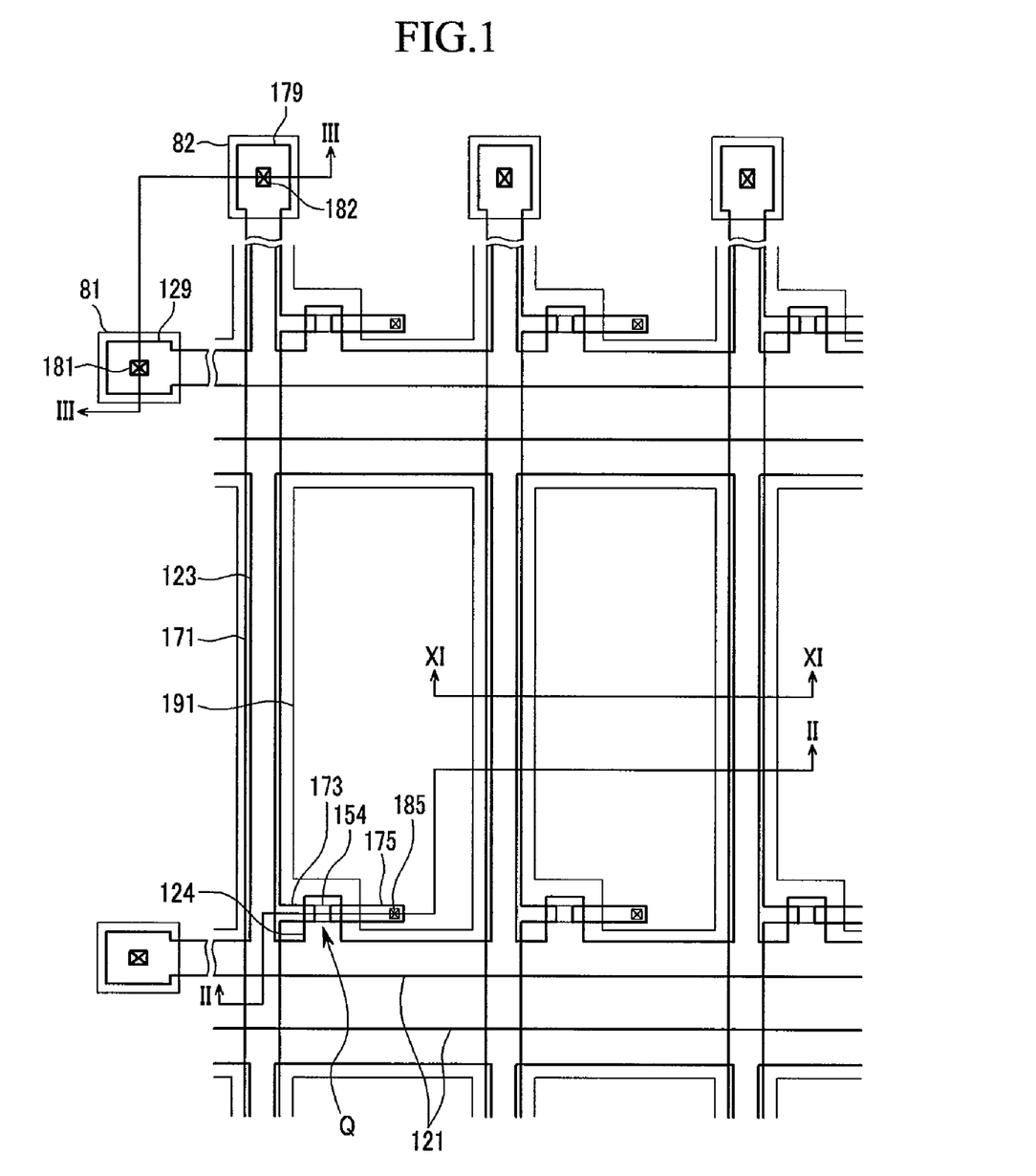
FIG. 1 is a layout view of a thin film transistor array panel according to an exemplary embodiment of the present invention.
Figure 2:
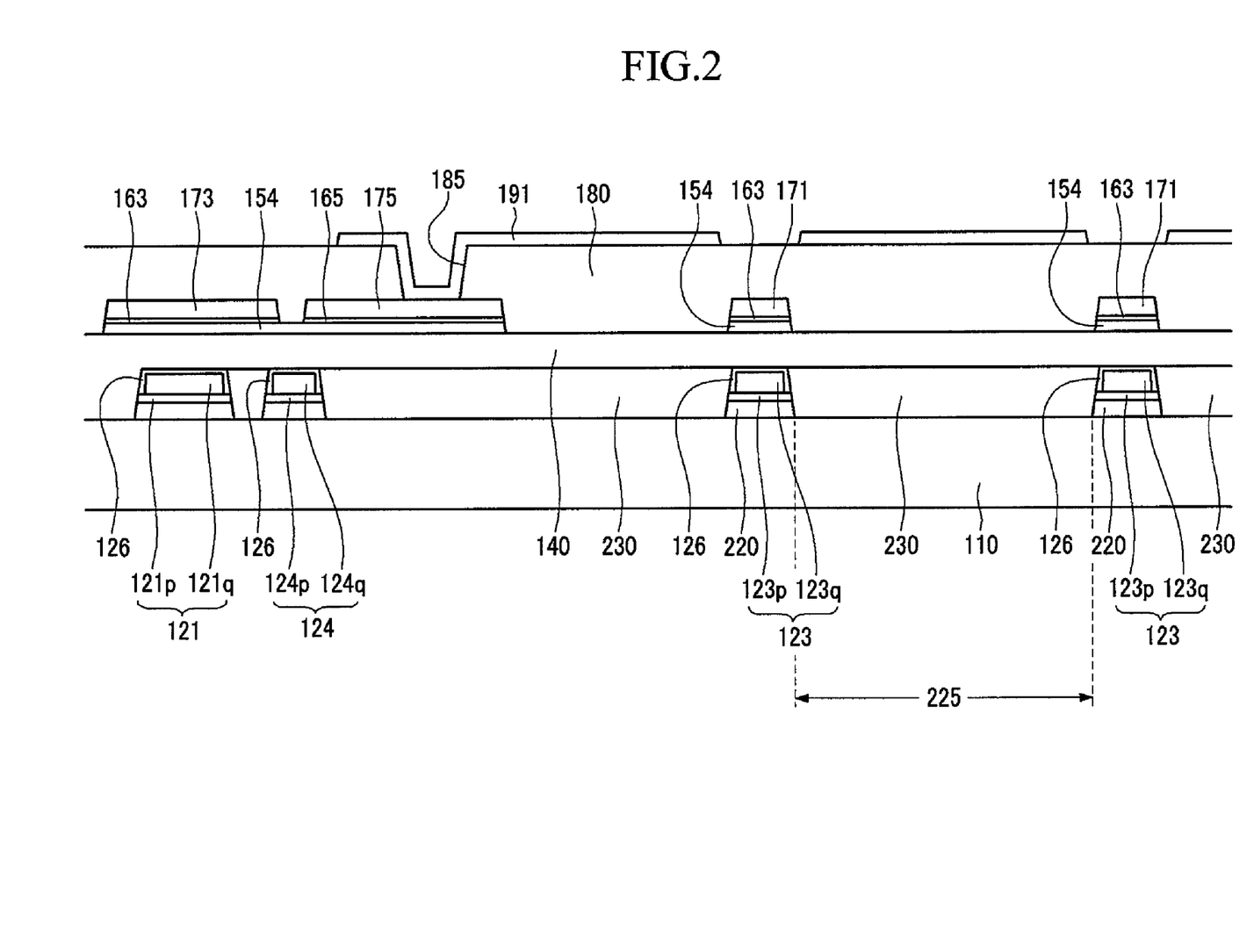
FIG. 2 is a cross-sectional view of the thin film transistor array panel shown in FIG. 1 taken along the line II-II.
Figure 3:
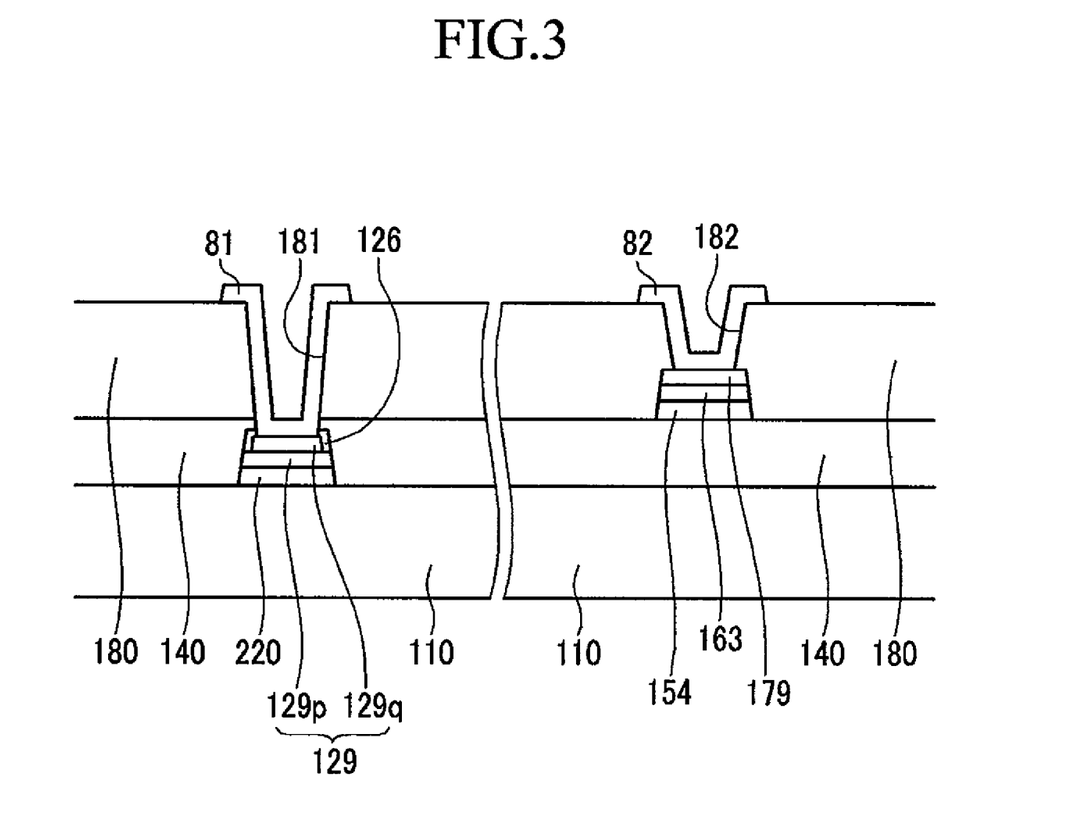
FIG. 3 is a cross-sectional view of the thin film transistor array panel shown in FIG. 1 taken along the line III-III.

FIG. 1 is a layout view of a thin film transistor array panel according to an exemplary embodiment of the present invention, FIG. 2 is a cross-sectional view of the thin film transistor array panel shown in FIG. 1 taken along the line II-II, and FIG. 3 is a cross-sectional view of the thin film transistor array panel shown in FIG. 1 taken along the line III-III.

Referring to FIG. 1 to FIG. 3, a light blocking member 220 is formed on a substrate 110 made of an insulating material such as glass or plastic. The light blocking member 220, as shown in FIG. 1, has a planar shape similar to a plurality of ladders, each ladder extending in a horizontal direction and the ladders being arranged side-side in a vertical direction. The light blocking member 220 is made of an inorganic material selected from carbon black, or metals such as chromium (Cr), iron (Fe), nickel (Ni), and oxides thereof, or an organic material such as an acryl-based compound.

A plurality of gate lines 121 is formed on the light blocking member 220. The gate lines 121 transmit gate signals, and have substantially the same planar shape as the light blocking member 220. In detail, each gate line 121 includes a pair of stem lines extending in a horizontal direction, a plurality of branch lines 123 connecting the two stem lines to each other, and a plurality of gate electrodes 124 protruding from the stem lines.

The light blocking member 220 and the gate lines 121 define a plurality of closed regions 225 arranged in a matrix shape. The closed regions 225 are enclosed by the light blocking member 220 and the gate lines 121, and they are substantially rectangular in shape, being bounded on two sides by the two stem lines of a gate line 121 and on two sides by branch lines 123. The gate electrodes 124 protrude into the closed regions 225, and the light blocking member 220 includes protrusions corresponding to the gate electrodes 124. The width of the gate lines 121 may be less than the width of the light blocking member 220. The closed regions 225 may have a different shape from the above described rectangular shape, and the shape of the gate lines 121 and the light blocking member 220 may be different from each other.

In the gate lines 121, one of the stem lines includes an end portion 129 with a wide area for connection with a different layer or an external driving circuit. However, two stem lines may be shaped to extend from one end portion 129.

The gate lines 121 have a dual-layered structure including a lower layer 121p and an upper layer 121q.

The upper layer 121q is made of copper (Cu) that is deposited on the lower layer 121p by using electroless plating. The lower layer 121p may be made of a metal such as molybdenum (Mo), titanium (Ti), or a molybdenum alloy such as MoW, MoTi, MoZr, and MoNb. The lower layer 121p made of the above-identified materials has good physical, chemical, and electrical contact characteristics with other materials, and in particular has good characteristics for the electroless plating of the copper thereon.

In FIG. 2, the gate electrodes 124 and the branch lines 123 respectively include a lower layer 124p and 123p and an upper layer 124q and 123q, and in FIG. 3, the end portions 129 include a lower layer 129p and an upper layer 129q.

The thickness of the upper layer 121q may be in a range of about 0.3 μm to about 2 μm, and the sum of the thickness of the gate line 121 and the thickness of the light blocking member 220 may be in a range of about 1 μm to about 4 μm. The gate line 121 together with the light blocking member form a barrier or a bank that surrounds or encloses each closed region 225. If the sum of the thickness of the gate line 121 and the thickness of the light blocking member 220 is less than about 1 μm, the combination of the gate line 121 and the light blocking member 220 may not function adequately as a partition. If the sum of the thickness of the gate line 121 and the thickness of the light blocking member 220 is more than about 4 μm, an excessive amount of material for the color filters 230 must be deposited in the closed regions 225 such that the material cost is increased. Also, if the color filter 230 does not fill the closed region 225 to a sufficient height, the height of the step formed between the partition and the color filter 230 is increased such that thin films disposed on the portions having the height difference may be disconnected or the liquid crystal may be non-uniformly filled.

The gate lines 121 include a coating 126 that is formed on the upper layer 121q of the gate lines 121. The coating 126 protects the upper layer 121q of the gate lines 121 from an etchant and may include a material such as $CuF_2$ or $CuF_xO_y$.

A plurality of color filters 230 are formed on the substrate 110.

The color filters 230 are disposed in the closed regions 225 whose boundaries are defined by the light blocking member 220 and the gate lines 121. The sides of the color filters 230 contact the light blocking member 220 and the gate lines 121, and the surface height of the plane boundary of the color filters 230 may be higher than the height of the light blocking member 220 and may be equal to or less than the height of the gate lines 121. If the thickness of the color filters 230 is the same as the sum of the thickness of the light blocking member 220 and the thickness of the gate line 121, deterioration due to the step may be prevented. The minimum thickness of the color filters 230 is about 1 μm.

The color filters 230 may each display a primary color such as one of the three primary colors of red, green, and blue, and may be made of an organic material.

A gate insulating layer 140 is formed on the color filters 230 and the coating 126. The surface of the gate insulating layer 140 may be flat and the gate insulating layer 140 may be made of an organic material.

A plurality of semiconductor regions 154, a plurality of ohmic contacts 163 and 165 formed on the semiconductor regions, and a plurality of data lines 171 formed on the ohmic contacts 163 and a plurality of drain electrodes 175 formed on the ohmic contacts 165 are sequentially formed on the gate insulating layer 140.

The data lines 171 transmit data signals and extend in a vertical direction as shown in FIG. 1. The data lines 171 overlap the branch lines 123 of the gate lines 121. Each data line 171 includes a plurality of source electrodes 173 extending toward the gate electrodes 124, and an end portion 179 having a wide area for connection to other layers or an external driving circuit. The drain electrodes 175 are separated from the data lines 171 and are disposed opposite to the source electrodes 173 and aligned with respect to the gate electrodes 124.

The semiconductor regions 154 may be made of a material such as hydrogenated amorphous silicon or polysilicon. The semiconductor regions 154 include portions exposed between the source electrodes 173 and the drain electrodes 175.

The ohmic contacts 163 and 165 include portions 163 disposed under the data lines 171 and portions 165 disposed under the drain electrodes 175, and reduce the contact resistance between the semiconductor regions 154, and the data lines 171 and drain electrodes 175. The ohmic contacts 163 and 165 may be made of amorphous silicon doped with an impurity of a high concentration, or of polysilicon.

The data lines 171 and the drain electrodes 175 have almost the same planar shape as the ohmic contacts 163 and 165, and the semiconductor regions 154 except for the portions of the semiconductor regions 154 exposed between the source electrodes 173 and the drain electrodes 175. However, they may not.

One gate electrode 124, one source electrode 173, and one drain electrode 175 constitute one thin film transistor (TFT) along with the semiconductor region 154. The channel of the thin film transistor Q is formed in the semiconductor region 154 between the source electrode 173 and the drain electrode 175.

A passivation layer 180 is formed on the data lines 171, the drain electrodes 175, the exposed portions of the semiconductor regions 154 and the gate insulating layer 140. The passivation layer 180 is made of an inorganic insulator such as silicon nitride ($SiN_x$) or silicon oxide ($SiO_x$). However, the passivation layer 180 may be made of a photosensitive organic insulator material. Also, the passivation layer 180 may have a dual-layered structure of an inorganic layer and an organic layer so as to not cause damage to the exposed portions of the semiconductor regions 154 while maintaining the excellent insulating characteristics of the organic layer.

The passivation layer 180 has a plurality of contact holes 182 and 185 respectively exposing the end portions 179 of the data lines 171 and the drain electrodes 175. Contact holes 181 extend through the passivation layer 180, the gate insulating layer 140, and the coating 126 to expose portions of the end portions 129 of the gate lines.

A plurality of pixel electrodes 191 and a plurality of contact assistants 81 and 82 are formed on the passivation layer 180. They may be made of a transparent conductive material such as ITO or IZO. The pixel electrodes 191 are connected to the drain electrodes 175 through the contact holes 185. The contact assistants 81 and 82 are connected to the end portions 129 of the gate lines 121 and the end portions 179 of the data lines 171 through the contact holes 181 and 182, respectively. The contact assistants 81 and 82 supplement adhesion between the end portions 129 of the gate lines 121 and the end portions 179 of the data lines 171 and an external apparatus, and protect the end portions 129 and 179.

Next, a manufacturing method of the thin film transistor array panel of FIG. 1 to FIG. 3 will be described with reference to FIG. 4 to FIG. 11 as well as FIG. 1 to FIG. 3.

Figure 9:
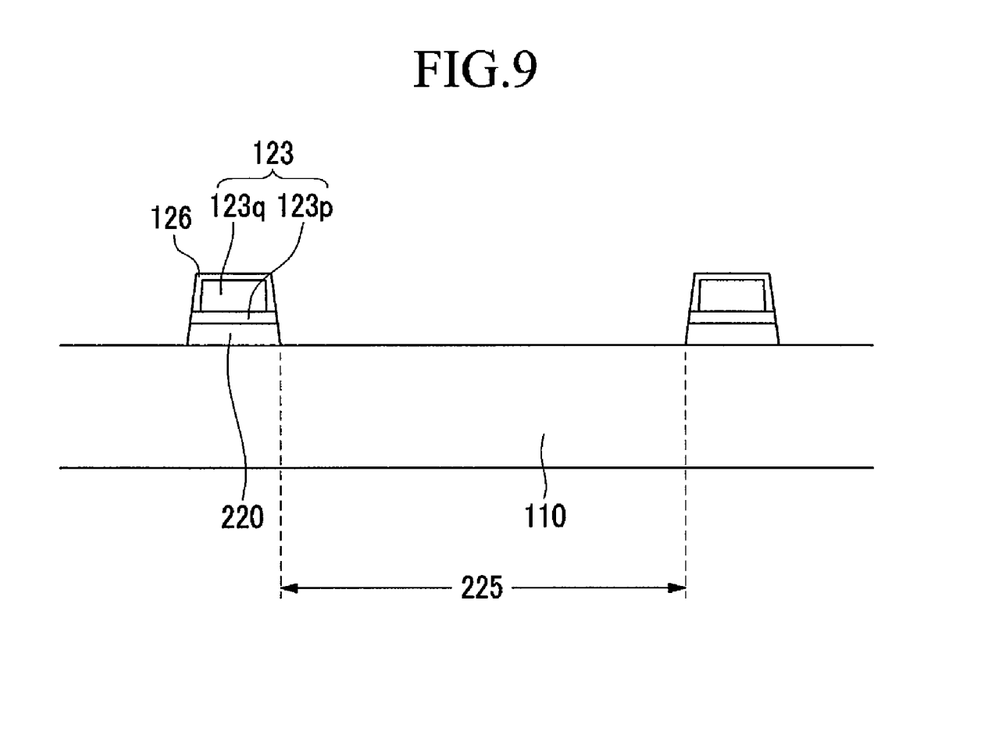
Figure 10:
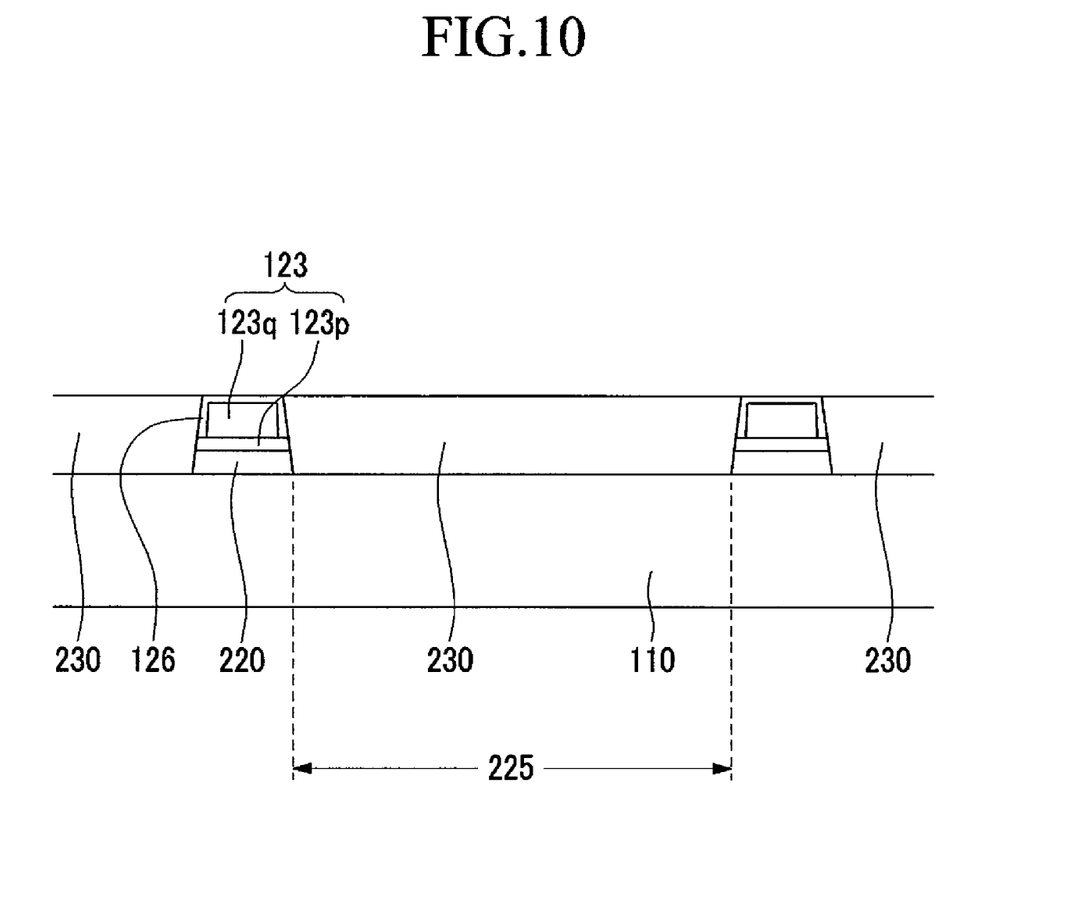
Figure 11:
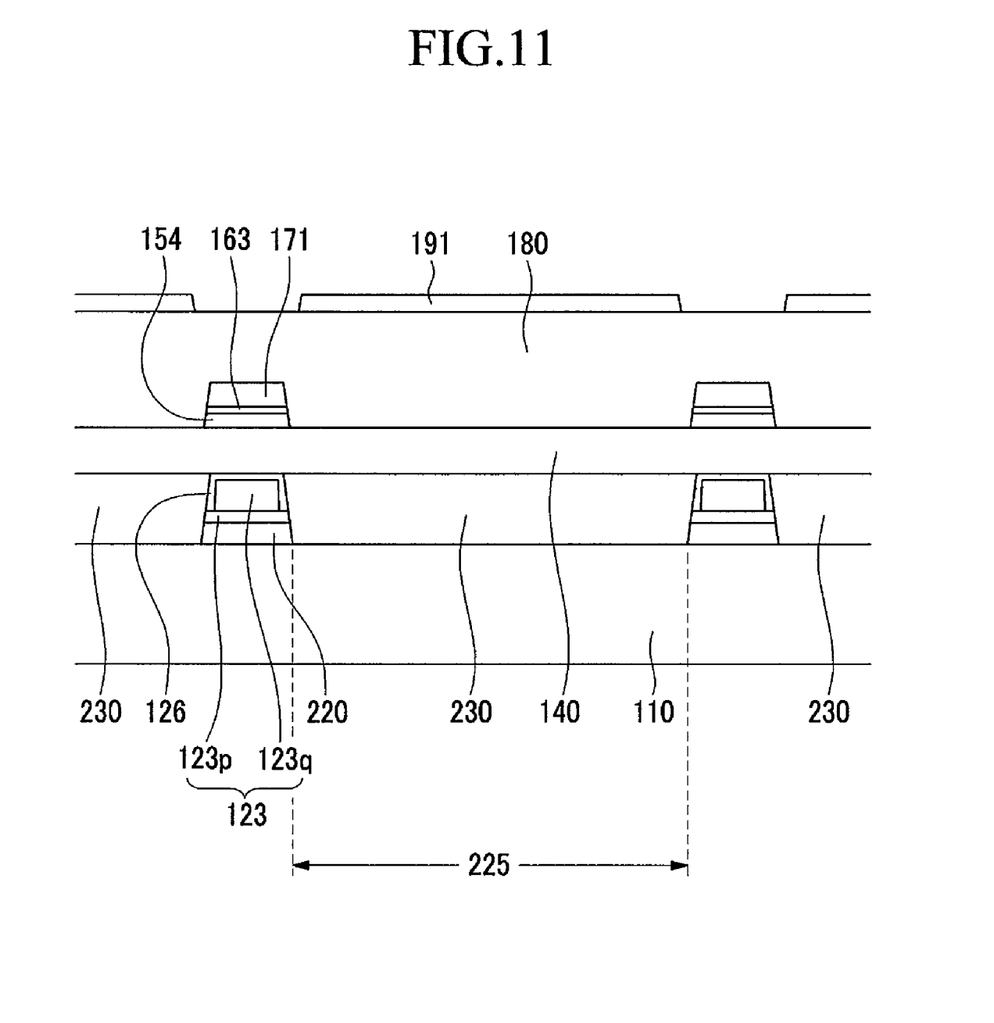

FIG. 11 is a cross-sectional view of the thin film transistor array panel shown in FIG. 1 taken along the line XI-XI, and FIG. 4 to FIG. 10 are cross-sectional views sequentially showing the thin film transistor array panel in the manufacturing process of the thin film transistor array panel shown in FIG. 11.

Figure 4:
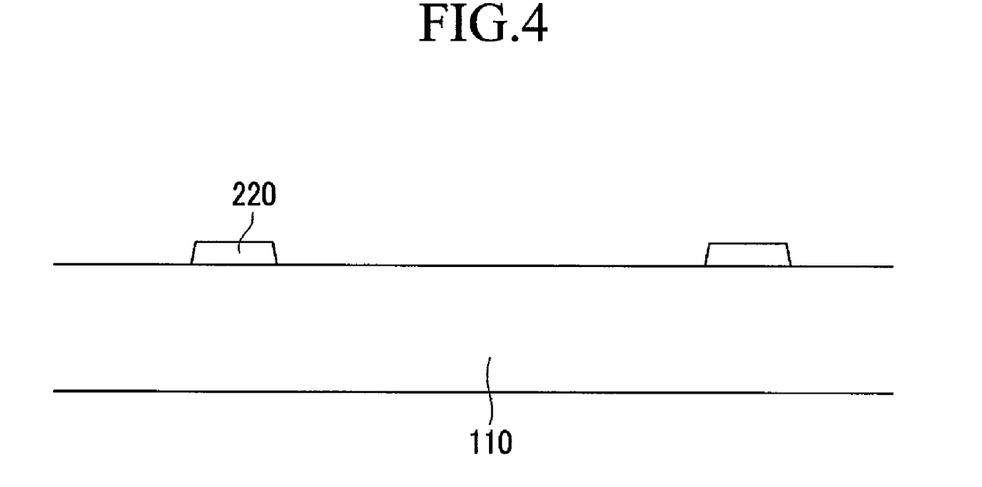
FIG. 4 to FIG. 11 are cross-sectional views sequentially showing the thin film transistor array panel in various stages of the manufacturing process of the thin film transistor array panel, and more particularly are cross-sectional views sequentially showing the thin film transistor array panel shown in FIG. 1 taken along the line XI-XI.

Firstly, as shown in FIG. 4, a light blocking member 220 is formed on a substrate 110. The light blocking member 220 may be made of an organic material or of an inorganic material such as a metal.

Figure 5:
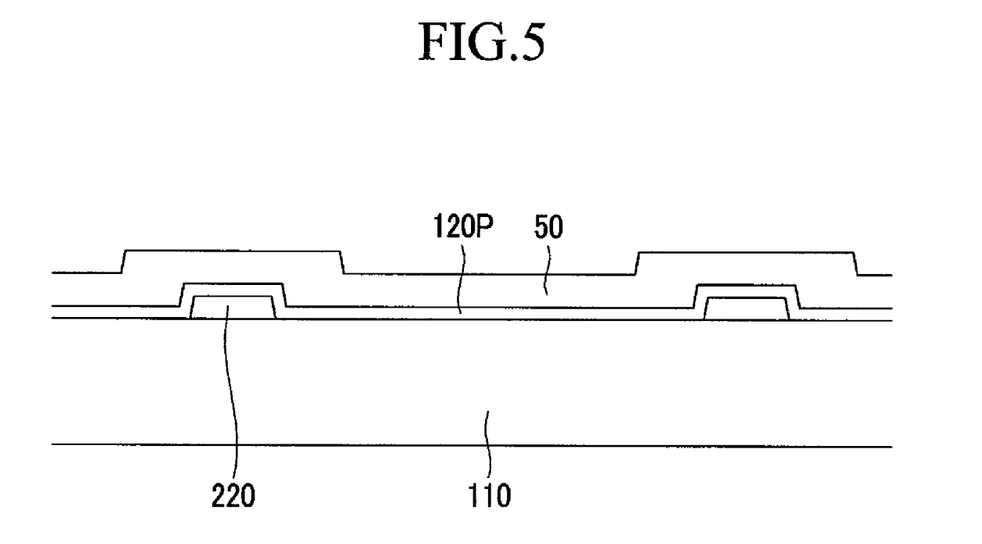

Next, as shown in FIG. 5, a metal layer 120P made of molybdenum (Mo), titanium (Ti), or a molybdenum alloy is deposited preferably by sputtering. The thickness of the metal layer 120P as deposited is in a range of about 100 Å to about 300 Å. Next, a film of a negative photosensitive material 50 is coated on the metal layer 120P by spin coating, slit coating, or slit and spin coating.

Figure 6:
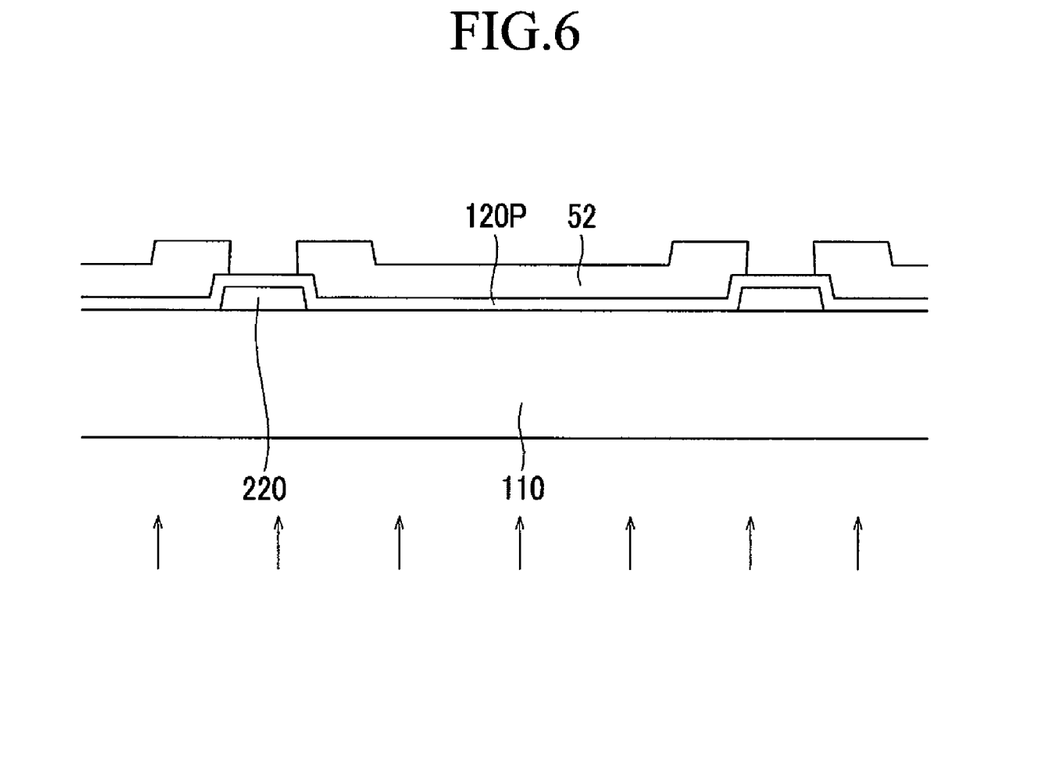

Next, as shown in FIG. 6, the negative photosensitive film 50 is rear-exposed and developed to form photoexposed members 52. The light used during the rear-exposure may be ultraviolet rays. Light that passes through the substrate 110 and the metal layer 120P is received at the negative photosensitive film 50, and portions at which the light is not received, the light being blocked by the light blocking member 220, are removed. The negative photosensitive film 50 of which the portions irradiated by the light are not removed is exposed and developed so that the side surfaces of the photoexposed members 52 at which the metal layer 120P is exposed are almost vertical with respect to the substrate 110. Also, the width of the space between two photoexposed members 52 may be less than the width of the light blocking member 220. The thickness of the metal layer 120P is in a range of about 100 Å to about 300 Å such that the light, in particular ultraviolet rays, may easily pass through the metal layer 120P.

Figure 7:
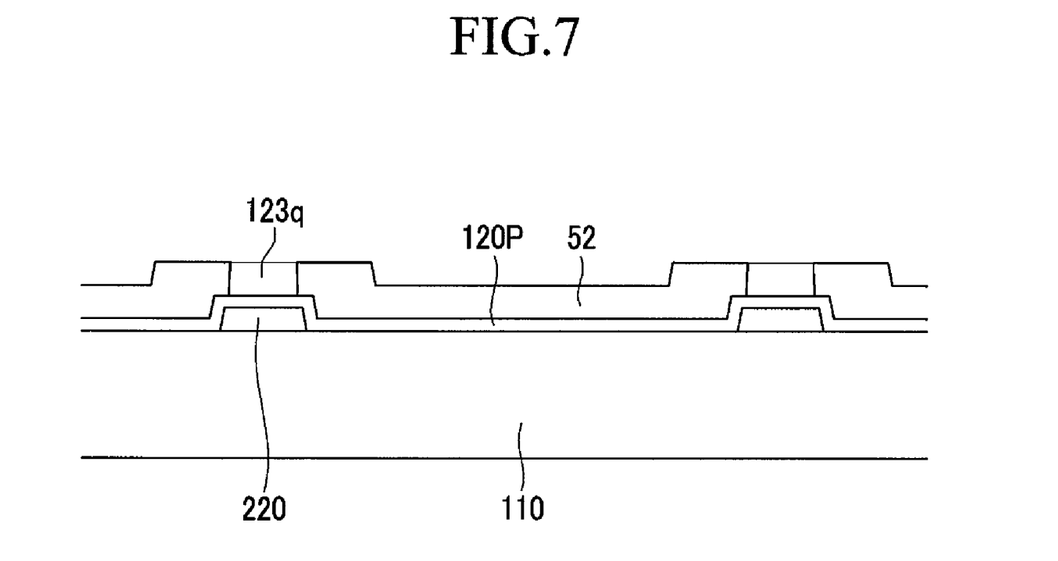
Figure 8:
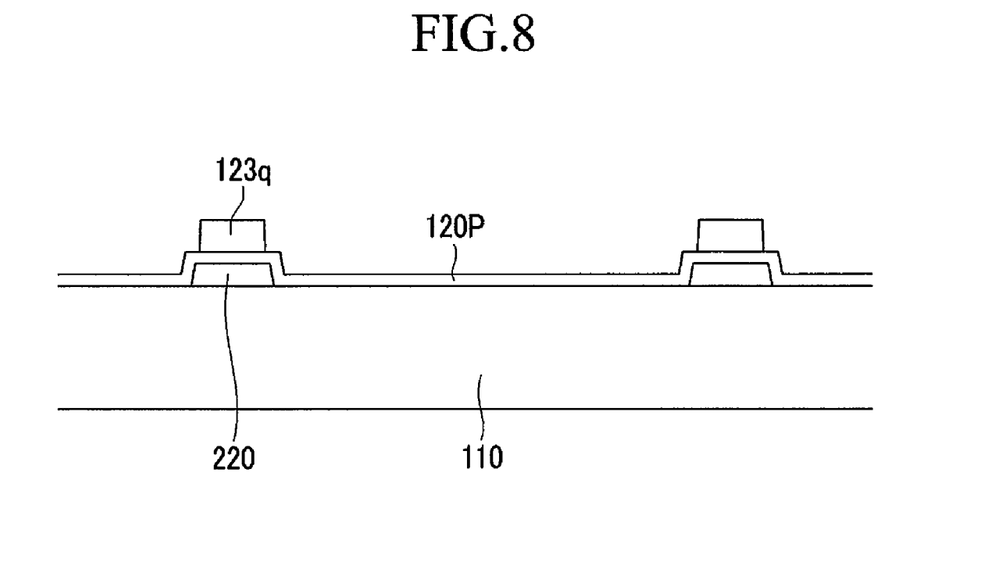

Next, as shown in FIG. 7, copper is deposited by electroless plating to form an upper layer 121q of the gate lines 121. In FIG. 7, the reference numeral 123q indicates the upper layer of the branch lines 123 of the gate lines 121. Here, the metal layer 120P that is made of molybdenum (Mo), titanium (Ti), or a molybdenum alloy functions as a seed layer for the copper. The upper layer 121q of the gate lines 121 may have substantially the same planar shape as the light blocking member 220, and the side surface thereof is almost vertical with respect to the substrate 110. When the width of the space between two of the photoexposed members 52 is less than the width of the light blocking member 220, the width of the upper layer 121q may be less than the width of the light blocking member 220. In FIG. 7, the reference numeral 123q indicates the upper layer of the branch lines 123 of the gate lines 121. The thickness of the upper layer 121q may be controlled by controlling the thickness of the negative photosensitive film 50. Next, as shown in FIG. 8, the photoexposed member 52 is removed by using a stripper.

Then, as shown in FIG. 9, the exposed portions of the metal layer 120P that are not covered by the upper layer 121q are removed by etching to form a lower layer 121p of the gate lines 121. In FIG. 9, the reference numeral 123p indicates the lower layer of the branch lines 123 of the gate lines 121.

Accordingly, closed regions 225 are formed by the light blocking member 220 and the gate lines 121. A fluorine-based gas such as $SF_6$, $CF_4$, and $CHF_3$ may be used in the etching, and the metal layer 120P is etched while simultaneously a coating 126 is formed on the surface on the upper layer 121q by using this gas. The coating 126 is generated by reacting the fluorine-based gas and the copper, and is made of a material such as $CuF_2$ or $CuF_xO_y$. The gate line 121 includes the lower layer 121p, the upper layer 121q and the coating 126.

Next, as shown in FIG. 10, an organic material solution including pigments is deposited in the closed regions 225 by using an inkjet method and dried to form color filters 230. Here, the two layers of the light blocking member 220 and the gate line 121 function as a bank or barrier such that the required amount of organic material solution to form the color filters 230 is controlled based on the thicknesses of the light blocking member 220 and the gate lines 121. The surface of the organic material solution is preferably higher than the upper surface of the light blocking member 220, and may be equal to or less than the height of the upper surface of the gate lines 121. However, considering the surface tension of the organic material solution, the maximum height of the surface of the organic material solution disposed inside the closed regions 225 may be higher than the height of the upper surface of the gate lines 121.

Next, as shown in FIG. 11, a gate insulating layer 140 preferably comprising an organic material is formed. Semiconductor regions 154, ohmic contacts 163 and 165, data lines 171 including source electrodes 173, and drain electrodes 175 are then formed on the gate insulating layer 140. A passivation layer 180 is then deposited, and is etched along with the gate insulating layer 140 and the coatings 126 to form contact holes 181, and contact holes 182, and 185 in the passivation layer 180. Next, pixel electrodes 191 and contact assistants 81 and 82 are formed on the passivation layer 180.

Therefore, when forming the color filters 230 by using the inkjet method, the two layers of the light blocking member 220 and the gate line 121 are used as a bank or barrier such that an additional process to form the bank or barrier is not necessary. Accordingly, the manufacturing process of the thin film transistor array panel may be simplified, the manufacturing cost may be reduced, and the productivity may be improved.

Also, the thickness of the upper layer 121q is designed by controlling the thickness of the photosensitive film 50 such that the thickness of the upper layer 121q is increased and thus the resistance of the gate line 121 is reduced, and this is more advantageous than increasing the width of the gate line 121 in that the aperture ratio is not decreased.

Also, the gate lines 121 are formed with a self-aligning method using the light blocking member 220 as a mask such that a misalignment may be prevented and a small alignment margin is permitted. Therefore, the aperture ratio is improved.

While this disclosure of invention has been provided in connection with what is presently considered to be practical exemplary embodiments, it is to be understood that the present teachings are not limited to the disclosed embodiments, but, on the contrary, the teachings are intended to cover various modifications and equivalent arrangements included within the spirit and scope of the present disclosure.

What is claimed is:

1. A thin film transistor array panel comprising:
   a substrate;
   a light blocking member formed on the substrate;
   a gate line disposed on the light blocking member;
   a color filter having a portion contacting a side surface of the gate line;
   a gate insulating layer formed on the gate line and on the color filter;
   a data line and a drain electrode formed on the gate insulating layer; and
   a pixel electrode connected to the drain electrode,
   wherein the gate line has a substantially closed-loop shape that surrounds the color filter.

2. The thin film transistor array panel of claim 1, wherein a planar shape of the gate line is substantially the same as a planar shape of the light blocking member.

3. The thin film transistor array panel of claim 2, wherein the planar shape of the light blocking member is a ladder shape.

4. The thin film transistor array panel of claim 1, wherein the gate line comprises copper.

5. The thin film transistor array panel of claim 4, wherein the gate line comprises an upper layer and a lower layer, and the upper layer includes copper.

6. The thin film transistor array panel of claim 5, wherein the gate line further comprises a coating formed on a surface of the upper layer.

7. The thin film transistor array panel of claim 6, wherein the coating comprises CuF2 or CuFxOy.

8. The thin film transistor array panel of claim 5, wherein the lower layer comprises molybdenum or a molybdenum alloy.

9. The thin film transistor array panel of claim 1, wherein a sum of a thickness of the light blocking member and a thickness of the gate line is in a range of about 1 µm to about 4 µm.

10. The thin film transistor array panel of claim 5, wherein the thickness of the upper layer is in a range of about 0.3 µm to about 2 µm.

11. The thin film transistor array panel of claim 1, wherein a thickness of the color filter is equal to or less than the sum of a thickness of the light blocking member and a thickness of the gate line.

12. The thin film transistor array panel of claim 1, wherein the light blocking member comprises a metal or an organic material.

13. The thin film transistor array panel of claim 1, wherein the gate insulating layer comprises an organic material.

14. The thin film transistor array panel of claim 1,
   wherein the gate line comprises a pair of stem lines and a plurality of branch lines, and
   wherein the pair of stem lines and the plurality of branch lines together with the blocking member establish a barrier that defines a closed region.

* * * * *